(12) United States Patent
Chu

(10) Patent No.: US 7,570,466 B2
(45) Date of Patent: Aug. 4, 2009

(54) DUAL MODE NEGATIVE VOLTAGE SWITCHING

(75) Inventor: Daniel Chu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 11/069,175

(22) Filed: Mar. 1, 2005

(65) Prior Publication Data

US 2006/0197386 A1    Sep. 7, 2006

(51) Int. Cl.
*H02H 9/00* (2006.01)
(52) U.S. Cl. .................................................. 361/56
(58) Field of Classification Search .................... 361/56
See application file for complete search history.

(56) References Cited

U.S. PATENT DOCUMENTS 4,967,103 A * 10/1990 Dikken et al. ............. 326/34
6,014,041 A * 1/2000 Somasekhar et al. ....... 326/115
6,809,386 B2 * 10/2004 Chaine et al. ............... 257/368

* cited by examiner

*Primary Examiner*—Stephen W Jackson
(74) *Attorney, Agent, or Firm*—Trop, Pruner & Hu, P.C.

(57) ABSTRACT

A negative switch may enable switching of two different negative voltages. The switch may include a negative cascode bias generator which biases the gate of a cascade protection device. When the negative switch is passing a large negative voltage, the bias generator generates a lowered voltage to provide a cascade voltage for snapback protection of a passing transistor. When a relatively low negative voltage is to be switched, the bias generator may produce a positive voltage greater than the threshold voltage of the cascode protection device so that both high and low negative voltages may be switched by the same circuit without exposing the passing device to a voltage in excess of its snapback limit.

29 Claims, 4 Drawing Sheets

DUAL MODE NEGATIVE VOLTAGE SWITCHING

BACKGROUND

This invention relates generally to the field of semiconductor integrated circuits, and, more particularly, to negative switch circuits.

Various integrated circuits use negative voltages to perform certain operations. For example, flash memory devices may use a negative voltage as high as −9 volts to erase data stored on the flash memory cells. By maximizing the amount of negative voltage that can be applied to the flash memory cells, the overall performance of the flash memory device is typically improved. The performance of flash memory devices may be improved by reducing the amount of time it takes to erase the data stored in the flash memory cells or by reducing the charge loss in the flash memory cells. The flash memory may also use relatively low negative voltages, as low as −0.25 volts for example. One use of relatively lower negative voltages is to bias deselected word lines.

These negative voltages may be generated by negative charge pumps. Since the negative voltages are only needed at specific times, negative switches may be used to switch the supplied voltages.

Thus, there is a need for other ways to provide negative voltage switching.

DETAILED DESCRIPTION

Figure 1:
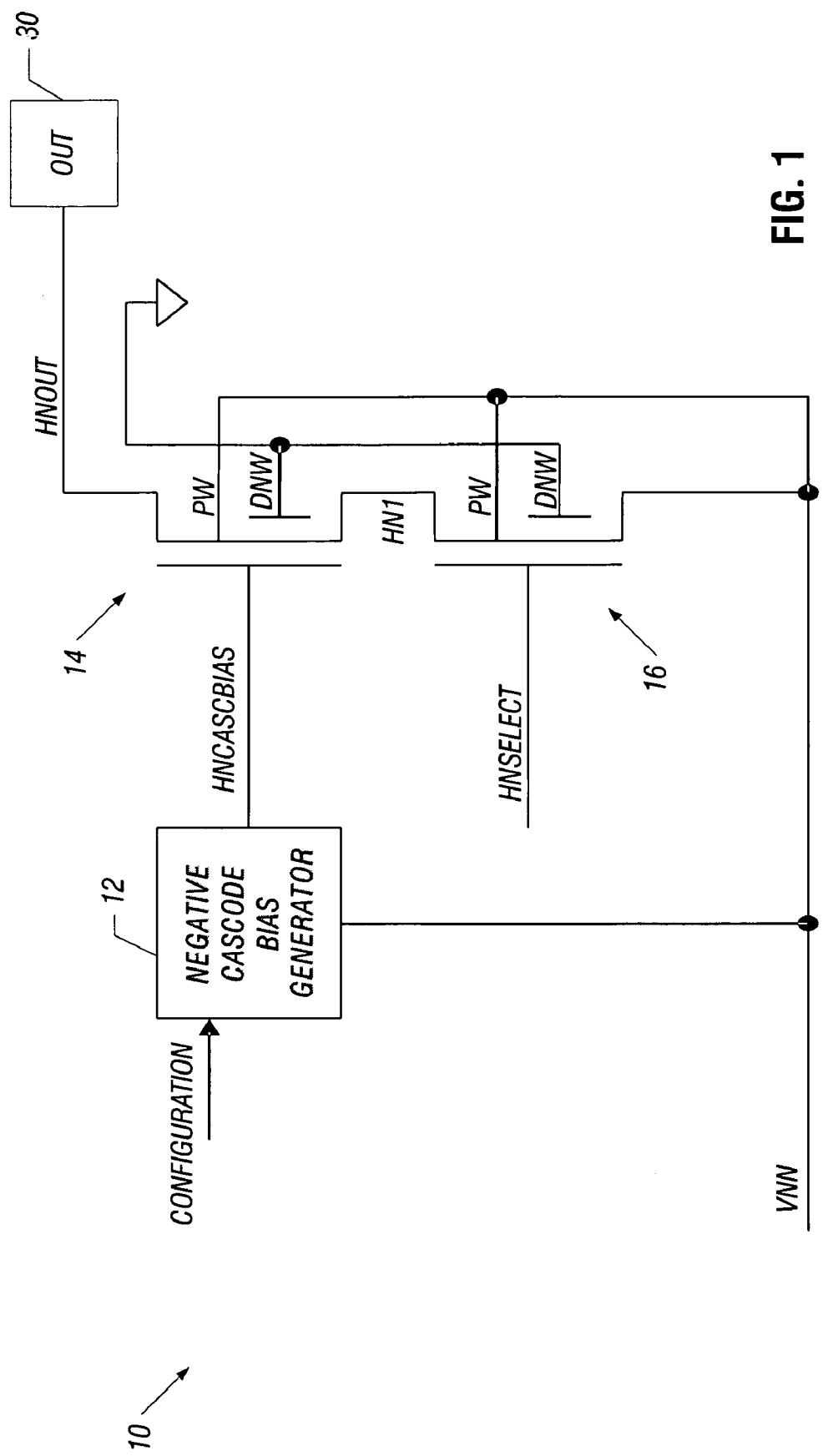
FIG. 1 is a schematic view of a dual mode negative voltage switch in accordance with one embodiment of the present invention.

Referring to FIG. 1, a negative switch 10 may switch a relatively low negative voltage from a first negative charge pump (not shown) and a relatively high negative voltage from a second charge pump (not shown). The negative voltages are supplied to the switch 10 on a line VNN 32. The output of the switch 10 (HNOUT) is available at the output 30. The circuit 10 includes a negative cascode bias generator 12 that enables dual mode negative switching or the provision of relatively low and relatively high negative voltage levels. The generator 12 receives a configuration signal as indicated and outputs a signal HNCASCBIAS.

A cascode circuit includes a cascode protection device 14 and an NMOS passing device 16. The source of the device 14 is coupled to the drain of the device 16. Each of the devices 14 and 16 may be triple well devices in a P-type substrate including a P-well (PW) and a deep N-well (DNW) as indicated, each of which are coupled together and the deep N-wells may also be grounded in some embodiments. By coupling the wells together, the same wells may be used for both devices 14, 16, saving space.

In some cases, it is advantageous to use a single switch for both very high and ultra low negative voltage switching. The very high negative voltage may be greater than the snapback limit of a single NMOS passing device 16. The snapback limit, which arises with high voltages, is reached when the current through the device is no longer a function of the applied gate voltage. To enable hot switching when the relatively high supply voltage is already present, the cascode protection device 14 provides snapback protection. Thus, the embodiments of the present invention may be useful in switching voltages in excess of the snapback limit of devices 14, 16.

At other times, it may be desirable to pass a small negative voltage through the same switch. The voltage may be less than the threshold voltage of the single NMOS passing device 16. In order to turn on the passing device 16 and the cascode protection device 14, a higher gate drive is needed. Then, both of the lower and higher negative voltages can be passed safely, with the ability to hot switch, using the configurable negative cascode bias generator 12.

The cascode protection device 14 protects the NMOS passing device 16. For passing negative voltages that exceed the snapback limit of the device 16, the cascode protection device 14 is biased with a safe voltage generated by the negative cascode bias generator 12. The negative cascode bias generator 12 creates a safe voltage named HNCASCBIAS. If the $V_{ds}$ snapback limit is less than the voltage passed from VNN to HNOUT, the bias generator 12 may be configured to bias the cascode protection device 14 in a way that provides snapback protection for the device 16. This may be done by lowering HNCASCBIAS.

For example, if the $V_{ds}$ snapback limit of the device 16 is 6 volts and the voltage passed to HNOUT from VNN is greater, for example, −8 volts, then the bias generator 12 may provide a bias (HNCASCBIAS) of about −4 volts. This −4 volts ensures that the voltage on the node HN1 is no greater than about −4.7 volts when the device 14 has current flowing through it. The node HN1 floats to a diode drop less than HNCASCBIAS. The $V_{ds}$ across device 16 is, therefore, limited to about 3.3 volts maximum, so it will not snapback. Similarly the $V_{ds}$ across device 16 floats to HN1 minus VNN.

In such case, HNOUT may be permitted to float and HNSELECT may be −8 volts. In another example, where VNN is −8 volts and HNSELECT is 2 volts, HNCASCBIAS may be −4 volts and HN1 may be −8 volts, while $V_{ds}$ device 16 may be zero volts and the output HNOUT may be −8 volts.

For passing negative voltages that are smaller than the threshold voltages of the devices 14 or 16, the bias generator 12 may be reconfigured by a configuration signal to output a voltage to turn on the device 14. For example, the voltage HNCASCBIAS may be about 2 volts, as one example. Any voltage above the threshold voltage of the device 14 may be used, however. The device 14 no longer provides snapback protection for the device 16 but, of course, such protection would not be needed because the passing voltages are below the voltage drain to source snapback limit. The higher gate drive on device 14 can also be used to lower the resistance of the switch passing the negative voltage.

As an example, if VNN is a small value negative voltage, such as −0.2 volts, HNSELECT may be −0.2 volts so that HNOUT floats or 2 volts so that HNOUT is −0.2 volts, while HNCASCBIAS may be 2 volts and the drain to source voltage of the device 16 is zero. In the case where the output floats, the node HN1 is at HNOUT and in the case where HNOUT is −0.2 volts, the node HN1 may be −0.2 volts. Thus, the bias of HNCASCBIAS may be raised to turn on the device 14 if the path is selected and a very low voltage is supplied on the input VNN.

Figure 2:
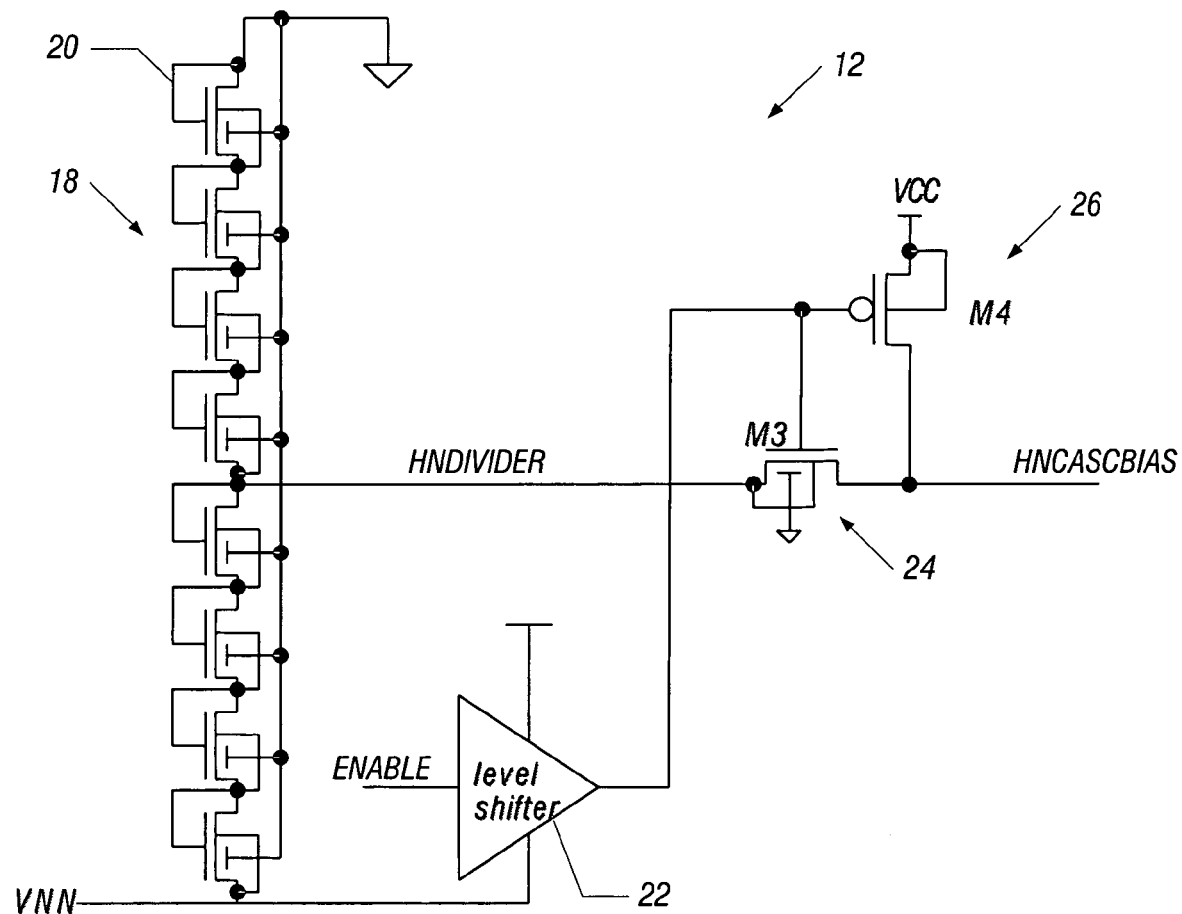
FIG. 2 is a circuit diagram showing the negative cascode bias generator of FIG. 1 in accordance with one embodiment of the present invention.

Referring to FIG. 2, an implementation of the bias generator 12 includes a voltage divider 18 which provides an output voltage HNDIVIDER. The upper end of the voltage divider 18 is grounded and includes four diode connected active devices 20. The lower end includes four diode connected active devices 20 coupled to VNN. Coupled to VNN is a level shifter 22 with an enable input that corresponds to the configuration signal of FIG. 1. Level shifter 22 is coupled to the gate of a PMOS transistor 26 which also receives a supply voltage on its source while its drain is coupled to HNCASCBIAS. Coupled to HNDIVIDER is an NMOS transistor 22 with its drain coupled to HNCASCBIAS and its gate controlled by the output from the level shifter 22.

When enabling larger negative voltages, the enable signal on the level shifter 22 is brought high. The level shifter 22 passes a voltage from the divider 18 using diode connected active devices 20. Other ways of implementing the voltage divider may also be used, including a resistor divider. A voltage is selected as the output of the voltage divider 18 that will guarantee that the device 16 will not snapback if switched. Thus, in this case, with where VNN is −8 volts, the voltage divider 18 provides an output signal HNDIVIDER of −4 volts.

The HNDIVIDER is provided on the source of the transistor 24 while its gate is turned on so that the HNDIVIDER is passed as HNCASCBIAS.

When passing lower voltages through the negative switch 10, the enable signal on the level shifter 22 is brought low. The low output from the level shifter 22 turns off the passing device 24 by removing its gate drive and turns on the device 26. Thus, HNDIVIDER is isolated from the output HNCASCBIAS and the output, instead, is provided by the supply voltage $V_{CC}$. The voltage $V_{CC}$ may be set high enough so that the device 14 in FIG. 1 will pass any small negative voltage. HNDIVIDER may float in this implementation but may stay between zero volts and VNN, so that it will not forward bias the wells of the device 24.

Thus, in some embodiments, hot switching may be possible where a voltage is passed without first lowering the supply and a negative voltage greater than the individual device snapback on that may be permitted. At a different time, the switch 10 can pass a small negative voltage, lower than the threshold voltage of an individual device, or configure it as a low resistance through increased gate drive. Thus, a dual mode switch may be implemented in some embodiments.

While the present invention is applicable in flash memories as described hereinafter, it may also have applicability in other negative switching environments. Thus, the present invention is not necessarily limited to flash embodiments. Passing devices of increased gate drive are used throughout the industry to pass low voltages through NMOS devices.

In some embodiments, triple, quadruple, or n-tuple cascading may be used. Triple or higher cascading may be used, for example, if the voltage to be passed is greater than twice the voltage of a single device's breakdown voltage. If all the cascode devices' gates are tied to a high enough (positive) voltage, then a low negative voltage can pass through all of them.

Figure 3:
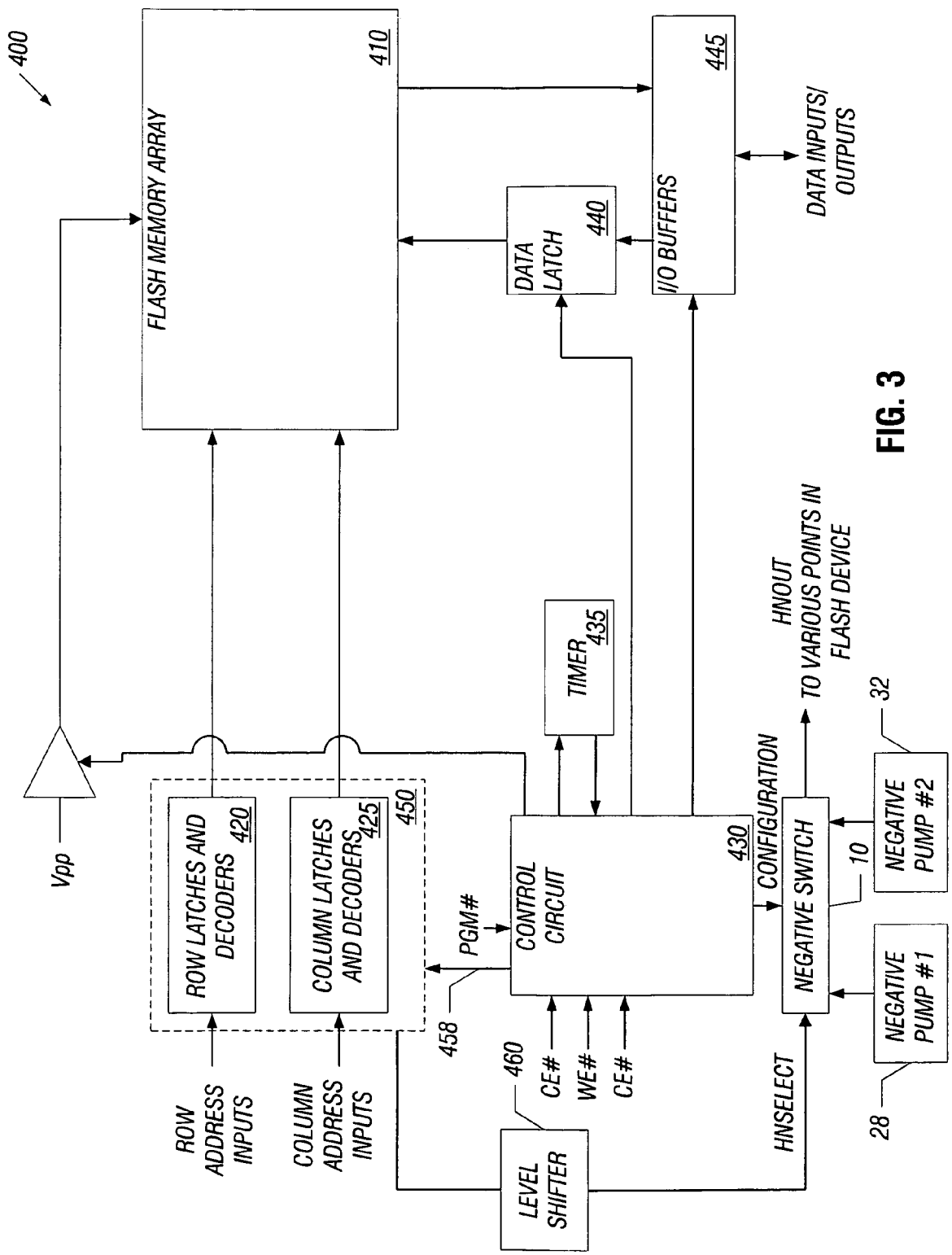
FIG. 3 is a circuit diagram for a flash memory in accordance with one embodiment of the present invention.

Referring to FIG. 3, in a flash memory 400, the flash memory cells within a flash memory array 410 are addressed by decoding circuit 450 which includes the row latches and decoders 420 and the column latches and decoders 425. The row latches and decoders 420 receive the row address inputs and the row latches and decoders 425 receive the column address inputs. The flash memory device 400 may incorporate the negative switch circuit 10 in its periphery in one embodiment.

The control circuit 430 receives the various control signals, such as a chip enable signal CE#, a write enable signal WE#, an output enable signal OE#, and a program control circuit PGM#. The addressing circuit 450, the control circuit 430, and the timer 435 may be used to control the reading, writing, and erasing of flash memory cells.

Data is input and output from the flash memory device 400 via the input/output (I/O) buffers 445. Input data is latched in the flash memory array 410 by the data latch 440, which may be controlled by the control circuit 430.

The control circuit 430 may supply the configuration signal to the negative switch 10. The negative switch 10 receives, as VNN, the signals from a first negative charge pump 28 and a second negative charge pump 32. The switch 10 outputs the signal HNOUT to various circuits within the flash memory that need relatively high or low negative voltage.

The signal HNSELECT is also initiated as a signal 458 from the control circuit 430. The signal 458 is sent to addressing circuit 450 that outputs a signal to a level shifter 460. The output of the level shifter 460 is HNSELECT.

If the memory array is divided into memory blocks, then the row latches and decoders 420 may also include the block latches and decoders.

Figure 4:
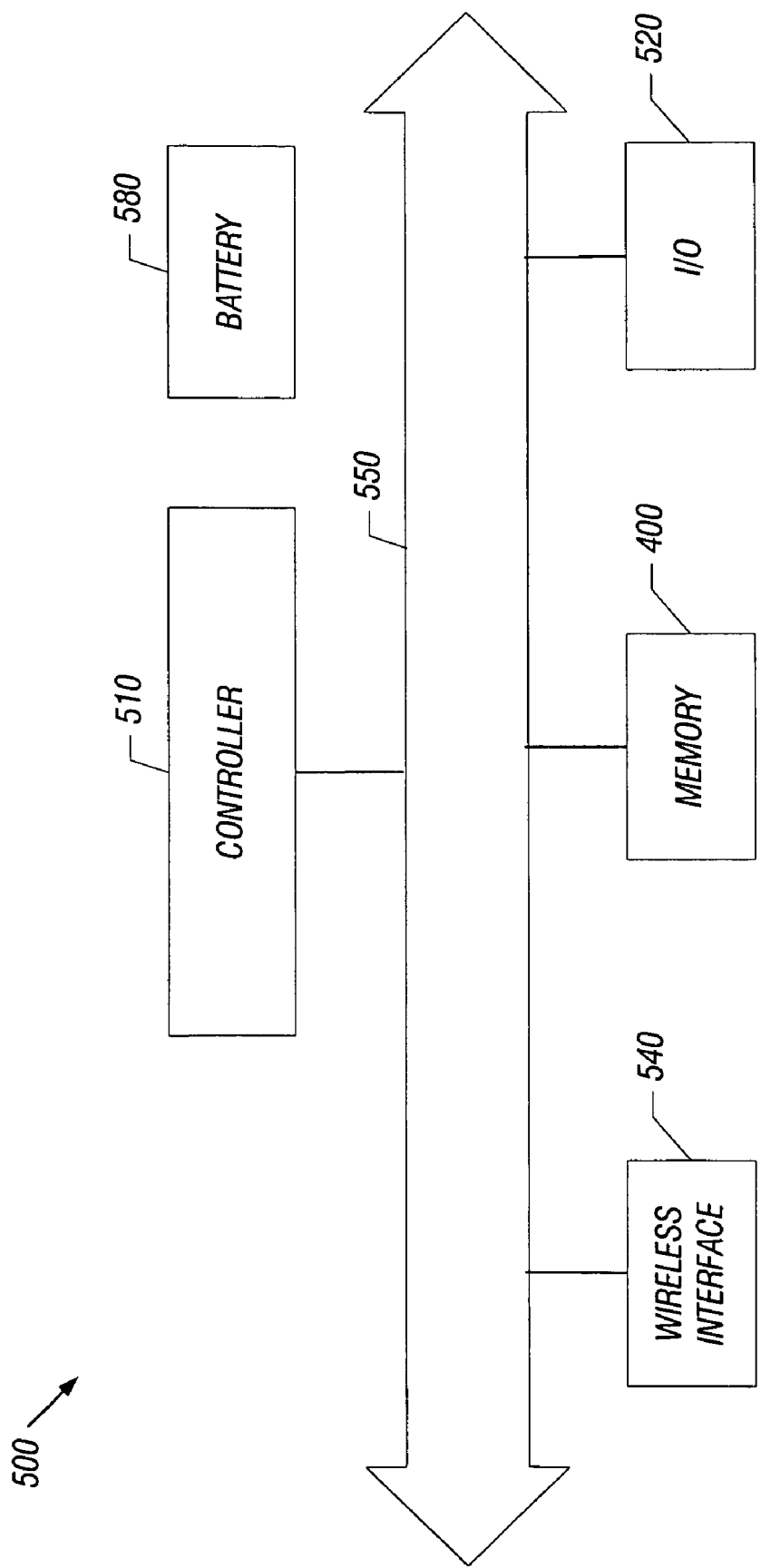
FIG. 4 is a system depiction in accordance with one embodiment of the present invention.

Referring to FIG. 4, the flash memory device 400 may be used in various types of computer systems 500. The computer system 500, within which the flash memory drives 400 is used, can be, as examples, a personal computer, a notebook computer, a laptop computer, a personal digital assistant, a minicomputer, a work station, a mainframe, a multiprocessor, a camera, a cell phone, or other devices.

The system 500 may include a controller 510. The controller 510 may, for example, be a microcontroller, a microprocessor, multiple microprocessors, or a digital signal processor. The system 500 may be powered by a battery 580, in one embodiment, although the present invention is not so limited.

The controller 510 is coupled to a bus 550 which connects to additional components including a wireless interface 540, the memory 400, and input/outputs 520. The input/outputs (I/O) 520 may be any conventional input/output device including a display, a touchpad, a keyboard, or a mouse, to mention a few examples. The wireless interface 540 may enable any wireless standard including cellular telephone communications or wireless network communications, as two examples. In one embodiment, the wireless interface 540 may be a dipole antenna.

While the present invention is not limited to wireless applications, in a wireless application, the memory 400 may, for example, store messages that are communication from the system 500 and received thereby.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    selectively generating a first bias voltage when a lower negative voltage is to be switched and a second bias voltage when a higher negative voltage is to be switched; and
    coupling said bias voltages to a cascode switch.

2. The method of claim 1 including coupling said bias voltages to the gate of a cascode protection device coupled in series with a passing device.

3. The method of claim 2 including forming said devices in a triple well.

4. The method of claim 2 including producing a switched output voltage in excess of the snapback limit of said devices.

5. The method of claim 2 including producing a switched output voltage that is less than the threshold voltage of the passing device.

6. The method of claim 1 including dividing an input voltage and providing said divided input voltage to a transistor that selectively passes said divided input voltage.

7. The method of claim 2 including providing the first bias voltage to turn on the cascode protection device when a low negative voltage is to be switched.

8. The method of claim 2 including selectively providing a lower first bias voltage and higher second bias voltage and providing said second bias voltage when a higher negative voltage is to be switched.

9. The method of claim 8 including maintaining said passing device below its snapback limit.

10. A negative switch comprising:
a negative cascode bias generator to selectively generate a first bias voltage when a lower negative voltage is to be switched and a second bias voltage when a higher negative voltage is to be switched.

11. The switch of claim 10 including a cascode circuit having a passing device and a cascade protection device coupled in series with said passing device, said first and second bias voltages coupled to a gate of said cascode protection device.

12. The switch of claim 11 wherein said devices are triple well devices.

13. The switch of claim 11, said switch to produce a switched output voltage in excess of the snapback limit of said devices.

14. The switch of claim 11, said switch to provide a switched output voltage that is less than the threshold voltage of the passing device.

15. The switch of claim 10 including a cascade circuit coupled to receive said bias voltages.

16. The switch of claim 10 wherein said bias generator includes a divider to divide an input voltage and a transistor to selectively receive said divided input voltage.

17. The switch of claim 11 wherein said bias generator to provide a first bias voltage to turn on the cascode protection device when a lower negative voltage is to be output by said switch, said bias generator to selectively provide a lower first bias voltage and a higher second bias voltage and to provide said second bias voltage when a higher negative voltage is to be switched.

18. The switch of claim 17 wherein said bias generator to maintain said passing device at a bias voltage below its snapback limit.

19. The switch of claim 17 said passing device to receive on its gate a signal to select whether said switch output floats or provides the lower or higher negative voltage.

20. A flash memory comprising:
a negative cascode bias generator to selectively generate a first biased voltage when a lower negative voltage is to be switched and a second biased voltage when a higher negative voltage is to be switched; and
a cascode circuit, coupled to said generator, said circuit including a passing device and a cascode protection device coupled in series.

21. The memory of claim 20 wherein said devices are triple well devices.

22. The memory of claim 20 wherein said cascode circuit produces a switched output voltage above a snapback limit of a said devices.

23. The memory of claim 22, said cascade circuit to provide a switched output voltage that is less than the threshold voltage of the passing device.

24. A processor-based system comprising:
a bias generator to selectively generate a first bias voltage when a lower negative voltage is to be switched and a second bias voltage when a higher negative voltage a higher negative voltage is to be switched;
a cascode circuit coupled to said bias generator; and
a battery coupled to supply power to said bias generator and said cascade switch.

25. The system of claim 24 wherein said bias generator includes a transistor and a divider to divide an input voltage and to provide the divided input voltage to said transistor to selectively pass said divided input voltage.

26. The system of claim 25 wherein said cascode circuit includes a cascade protection device coupled in series with a passing device.

27. The system of claim 26 wherein said cascade circuit to produce a switched output voltage in excess of the snapback limit of said devices.

28. The system of claim 27 wherein said cascade circuit to provide a switched output voltage that is less than the threshold voltage of said passing device.

29. The system of claim 28 wherein said devices are triple well devices.

* * * * *

UNITED STATES PATENT AND TRADEMARK OFFICE
CERTIFICATE OF CORRECTION

| | | |
|---|---|---|
| PATENT NO. | : 7,570,466 B2 | Page 1 of 1 |
| APPLICATION NO. | : 11/069175 | |
| DATED | : August 4, 2009 | |
| INVENTOR(S) | : Dan Chu | |

It is certified that error appears in the above-identified patent and that said Letters Patent is hereby corrected as shown below:

Col. 5:
Lines 23, 25 and 35, "cascade" should be --cascode--;

Col. 6:
Lines 20, 30, 36, 38 and 41, "cascade" should be --cascode--.

Signed and Sealed this
Twenty-third Day of October, 2012

David J. Kappos
*Director of the United States Patent and Trademark Office*